United States Patent
Lederman et al.

[11] Patent Number: 6,166,891
[45] Date of Patent: *Dec. 26, 2000

[54] MAGNETORESISTIVE SENSOR FOR HIGH TEMPERATURE ENVIRONMENT USING IRIDIUM MANGANESE

[75] Inventors: Marcos M. Lederman, San Francisco; Daniel A. Nepela; Hua-Ching Tong, both of San Jose, all of Calif.

[73] Assignee: Read-Rite Corporation, Milpitas, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/885,283

[22] Filed: Jun. 30, 1997

[51] Int. Cl.$^7$ .................................................. G11B 5/127
[52] U.S. Cl. ................................... 360/313; 360/320
[58] Field of Search ........................... 360/113, 313, 360/320

[56] References Cited

U.S. PATENT DOCUMENTS

| | | | |
|---|---|---|---|
| 5,287,237 | 2/1994 | Kitada et al. | 360/113 |
| 5,315,468 | 5/1994 | Lin et al. | 360/113 |
| 5,552,949 | 9/1996 | Hashimoto et al. | 360/113 |
| 5,574,605 | 11/1996 | Baumgart et al. | 29/603.16 |
| 5,691,864 | 11/1997 | Saito | 360/113 |
| 5,768,067 | 6/1998 | Saito et al. | 360/113 |

*Primary Examiner*—David Davis
*Attorney, Agent, or Firm*—Nathan N. Kallman

[57] ABSTRACT

A magnetoresistive read sensor fabricated on a substrate includes a ferromagnetic layer that is exchange coupled with an antiferromagnetic layer made of a defined composition of iridium manganese. A tantalum layer is used so that the exchange field and coercivity do not change with variations in annealing temperature. The antiferromagnetic layer is formed with a material composition of $Ir_x Mn_{100-x}$, wherein x is in the range of $15<x>23$. In an embodiment of a spin valve structure, the tantalum layer is disposed over the substrate and the antiferromagnetic layer is in direct contact with a pinned ferromagnetic layer. In another embodiment, the IrMn layer is formed over a soft active layer. In a third embodiment using exchange pinning, spaced IrMn regions are formed over the active magnetoresistive layer to define the sensor track width.

1 Claim, 1 Drawing Sheet

MAGNETORESISTIVE SENSOR FOR HIGH TEMPERATURE ENVIRONMENT USING IRIDIUM MANGANESE

BACKGROUND OF THE INVENTION

1. Field of the Invention

The present invention is related to magnetoresistive (MR) and spin valve sensors for sensing magnetic fields, and in particular to a magnetic recording system utilizing an MR read sensor for use in high temperature environments.

2. Background Art

A magnetoresistive (MR) sensor detects magnetic fields by detecting a change in resistance of a read element. MR read sensors are used in magnetic disk and tape systems to read signals in the form of changes in magnetic flux recorded on a recording medium. Typical MR read sensors are rectangular multi-layered structures in which thin film layers are deposited on a substrate.

Presently known thin film magnetic heads, known as merged heads, include an inductive write element for recording signals and a magnetoresistive (MR) sensor for reading the recorded signals. Write operations are carried out inductively using a pair of magnetic write poles which form a magnetic path and define a transducing nonmagnetic gap in the pole tip region. The transducing gap is positioned close to the surface of an adjacent recording medium such as a rotating magnetic disk. An electrical coil formed between the poles causes flux flow in the magnetic path of the poles in response to a current in the coil that is representative of signal information to be recorded.

Read operations are carried out by the MR sensor which changes resistance in response to changes in magnetic flux on the adjacent magnetic medium. A sensing electric current passed through the MR sensor senses the resistance of the MR sensor, which changes in proportion to changes in the magnetic flux.

A greater magnetoresistance has been found in devices called giant magnetoresistive (GMR) sensors. In spin valve structures two ferromagnetic (FM) layers are separated by a copper layer. One of the two ferromagnetic layers has its magnetic moment fixed or pinned by exchange coupling to an antiferromagnetic (AFM) film. The application of an external magnetic field causes a change in the relative magnetic orientation of one of the FM layers relative to the other FM layer. This causes a change in the spin-dependent scattering of conduction electrons and therefore the electrical resistance of the device.

Magnetic storage devices such as disk drives are being used more and more in environments wherein the ambient temperature is high, perhaps 100 degrees Centigrade. If the temperature exceeds the Neel temperature of the pinning layer, the magnetic properties will be adversely affected and the disk drive will be rendered subject to errors or inoperable.

In the past, the material chosen for the antiferromagnetic (AFM) layer of a spin valve device is the alloy iron manganese (FeMn). In U.S. Pat. No. 5,552,949 to Hashimoto et al., entitled "Magnetoresistance Effect Element With Improved Antiferromagnetic Layer", issued Sep. 3, 1996, the alloy iridium manganese (IrMn) was chosen to reduce the corrosive effects of the acids used in the manufacturing process. In the Hashimoto et al. patent, an MR element comprising an exchange coupled film is formed on a substrate. The exchange coupled film comprises an AFM layer made of IrMn and an FM layer at least part of which is laminated with the AFM layer. Electrodes provide an electric current to the FM layer. The AFM layer comprises $Ir_{100-z} Mn_z$ wherein the composition of iridium is in the range $24<=z<=75$.

However, this composition of iridium manganese does not have a high blocking (Neel) temperature and loses desirable magnetic properties at high temperatures.

What is needed is a spin valve sensor that is fabricated of an AFM material that will not lose its magnetic properties at high operating temperatures.

SUMMARY OF THE INVENTION

In accordance with this invention, a magnetoresistive sensor device is formed with a nonmagnetic buffer layer of metal, such as tantalum (Ta), that is deposited on a substrate. A Permalloy (NiFe) film is directly deposited on a Ta layer for texturing purposes and IrMn is then deposited on the NiFe film. The AFM layer comprises $Ir_x Mn_{100-x}$, wherein x is in the range of 15 to 23. Electrodes are coupled to the FeMn layer.

In accordance with an embodiment of the invention the nonmagnetic buffer layer is approximately 50 Angstroms thick, and the IrMn AFM layer is approximately 100 Angstroms thick.

The invention using the Ta buffer is insensitive to temperatures as high as 295 degrees Centigrade. Without the use of the Ta buffer, the device would adversely change its magnetic performance if the temperature is raised above 200 degrees Centigrade.

DESCRIPTION OF THE PREFERRED EMBODIMENT

Figure 1:
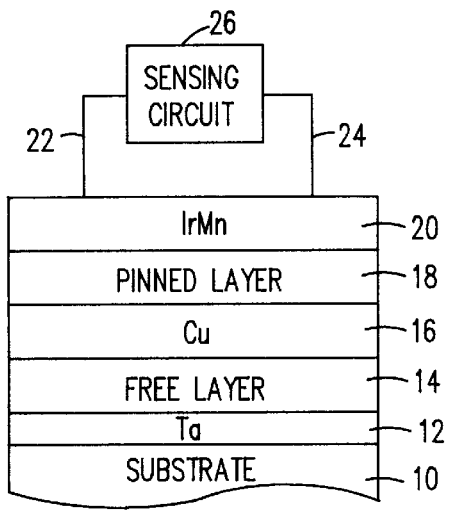
FIG. 1 is a diagram of the structure of a spin valve sensor embodying the present invention.

In an embodiment of a spin valve structure, according to the present invention, as shown in FIG. 1, a layer of Ta serving as a buffer layer 12 is formed on a substrate 10. Next, a free FM layer 14, made of NiFe, CoFe, Co, or a combination of any of these, is formed over the buffer layer 12, followed by a copper spacer 16. A pinned FM layer 18, which may be made of NiFe, CoFe, Co, or a combination of any of these, is then deposited over the copper spacer 16.

In accordance with this invention, an AFM layer 20 of iridium manganese (IrMn) is deposited over the pinned layer 18. The pinned layer 18 is exchange coupled to the AFM layer 20. Electrodes 22, 24 are fabricated to connect the spin valve structure to a sensing circuit 26.

The use of IrMn that is deposited on NiFe, and the use of the Ta buffer with NiFe realizes a high exchange, high blocking temperature device with very stable films. In keeping with this invention, the AFM layer 20 comprises $Ir_xMn_{100-x}$ wherein x is in the range of $15<x>23$ with a Ta buffer 12 under the NiFe FM free layer 14 of the spin-valve sensor. The range in which the desired magnetic properties are exhibited in accordance with the present invention is $Ir_{15}Mn_{85}$ to $Ir_{23}Mn_{77}$, with $Ir_{20}Mn_{80}$ being a preferred composition. The structures using a Ta buffer, as disclosed herein, do not experience change of He or Hc with change in annealing temperature, as has been observed with structures that do not use a Ta buffer.

In a preferred embodiment of the invention, the AFM layer 20 is about 100 Angstroms thick, the Ta buffer layer 12 is about 50 Angstroms thick, and the NiFe free layer 14 is about 50 Angstrom; thick.

Figure 2:
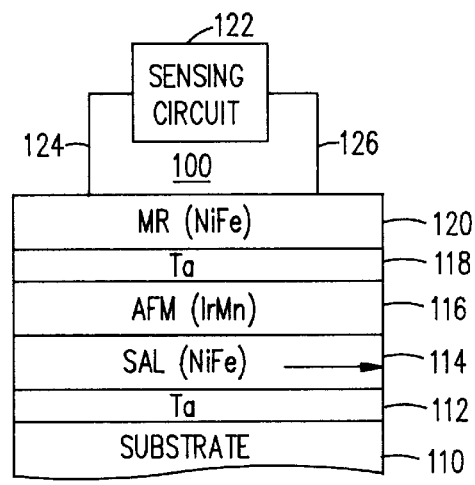
FIG. 2 is a diagram of the structure of an MR read head sensor embodying the present invention.

FIG. 2 illustrates a soft adjacent layer (SAL) type MR sensor, made in accordance with this invention. The sensor is shown as it would appear looking up from a magnetic medium, such as a disk. The MR sensor is fabricated using known techniques, for example, r.f. (radio frequency) or DC (direct current) sputtering. A substrate 110 is prepared on which a multi-layered structure Ta/NiFeX/IrMn/Ta/NiFeX, is deposited in sequential layers, where X is rhodium (Rh), tantalum (Ta) or rhenium (Re),. The sensor end regions are delineated by photolithography and by ion milling or etching subtractively. A central active region 100 is defined between the end regions. Electrically conductive leads 124, 126 are formed to connect the MR sensor to a signal sensing circuit 122.

The first NiFeX layer 114 serves as a soft adjacent layer or soft active layer (SAL). A Ta buffer layer 112 is formed between the substrate 110 and the NiFeX SAL layer 114. The IrMn layer 116 that is formed on the SAL layer 114 is AFM and has a high blocking temperature. The AFM layer 116 preferably comprises $Ir_xMn_{100-x}$, wherein x is in the range of 15 to 23. The range in which the desired magnetic properties are exhibited in accordance with the present invention is $Ir_{15}Mn_{85}$ to $Ir_{23}Mn_{77}$, with $Ir_{20}Mn_{80}$ being a preferred composition. A Ta layer 118 is formed on the IrMn layer 116, and an MR layer 120 of NiFe is deposited on the Ta layer 118. The sensor device is connected to a sensing circuit 122 by conductive leads 124, 126.

In this embodiment of the invention, the Ta buffer layer 112, between the substrate 110 and the SAL layer 114, is about 50 Angstroms thick. The AFM stabilization layer 116 is about 80 Angstroms thick and the Ta buffer layer 118 is about 20 Angstroms thick.

In this embodiment, the AFM layer 116 comprises $Ir_xMn_{100-x}$ wherein x is in the range of 15 to 23, with a Ta buffer 118 between the IrMn layer 116 and the NiFe layer 120. The range in which the desired magnetic properties are exhibited in accordance with the present invention is $Ir_{15}Mn_{85}$ to $Ir_{23}Mn_{77}$, with $Ir_{20}Mn_{80}$ being a preferred composition.

Figure 3:
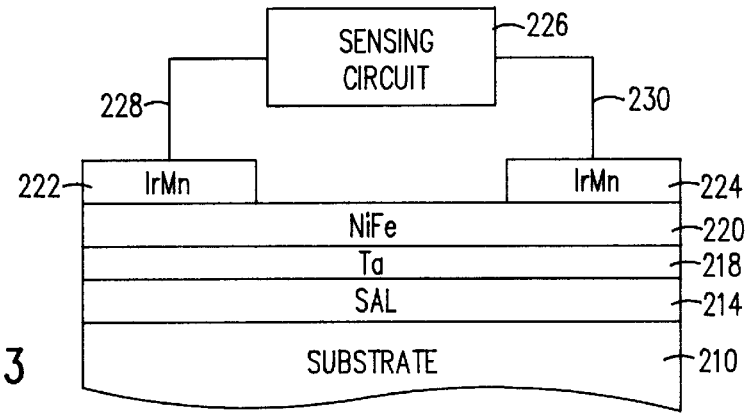
FIG. 3 is a diagram of a longitudinal exchange biased MR head.

FIG. 3 illustrates another embodiment of the invention of an MR read sensor with exchange pinning of the MR layer. The embodiment uses a defined composition of IrMn for AFM spaced regions 222 and 224. The structure is formed with a substrate 210 on which an SAL 214 is deposited. A Ta layer 218 is formed on the SAL 214 and an FM layer 220, preferably of NiFe, is deposited on the Ta layer 218. The spaced IrMn regions 222 and 224 are connected to a sensing circuit 226 by electrical conductive leads 228, 230. The same preferred composition of IrMn disclosed above is preferably used in this implementation of the invention.

IrMn has a higher Neel or blocking temperature than FeMn and is advantageous in high temperature environments. IrMn without a Ta buffer layer is unstable i.e. its exchange and coercivity change undesirably with temperature cycling during the annealing steps of fabrication.

Test results of devices fabricated with $Ir_{20}Mn_{80}$ indicate a blocking temperature of 190° C. and good magnetic properties. The film quality is good only when a Ta buffer layer is used over the substrate. If a Ta underlayer is not used, the coercivity Hc and exchange field He vary with annealing temperature.

Figure 4:
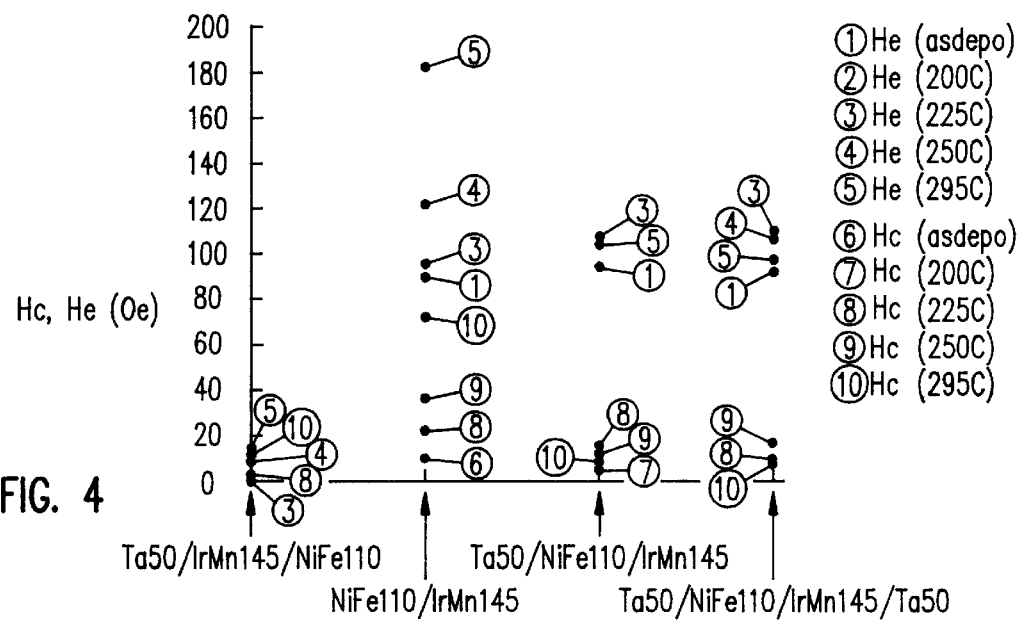
FIG. 4 is a graph wherein the exchange field He and coercivity Hc are plotted as a function of annealing temperature for a 110 Angstrom film of NiFe with different architectures incorporating IrMn.

FIG. 4 illustrates the exchange (He) and coercivity (Hc) in Oersteds (Oe) plotted as a function of annealing temperature for a 110 Angstrom film of NiFe with different architectures incorporating IrMn, with and without a Ta buffer layer. The architectures plotted are:

(1) A 50 Angstrom Ta layer on which a 145 Angstrom layer of IrMn is deposited and on which a 110 Angstrom layer of NiFe is deposited to form a layered structure (Ta50/IrMn145/NiFe110).

(2) A structure without a Ta buffer layer, wherein a 110 Angstrom layer of NiFe is deposited and on which a 145 Angstrom layer of IrMn is deposited (NiFe110/IrMn145).

(3) A 50 Angstrom Ta layer on which a 110 Angstrom layer of NiFe is deposited and on which a 145 Angstrom layer of IrMn is deposited (Ta50/NiFe110/IrMn145).

(4) A 50 Angstrom Ta layer on which a 110 Angstrom layer of NiFe is deposited and on which a 145 Angstrom layer of IrMn is deposited and on which a 50 Angstrom Ta layer is deposited (Ta50/NiFe110/IrMn145/Ta50).

The bottom NiFe layer of the spin-valve sensor has to be deposited on a Ta buffer layer, otherwise the Hc and He vary with annealing temperature as shown in case (2) above. As shown, an IrMn composition without a buffer layer is unstable i.e. its exchange (He) and coercivity (Hc) change, with temperature cycling during the annealing stages of fabrication.

From the plot of FIG. 4, it can be seen that in case (1) above wherein NiFe is deposited on IrMn, the exchange is very small. In cases (3 and 4) above, wherein IrMn is deposited on NiFe, the exchange is very good, with the addition of a Ta spacer layer deposited on the IrMn layer.

What is claimed is:

1. A magnetoresistive read sensor comprising:

a substrate;

a sensing device comprising a first tantalum layer deposited on said substrate;

a soft adjacent layer deposited over said first tantalum layer;

an antiferromagnetic layer comprising $Ir_x Mn_{100-x}$ wherein x is in the range of 15 to 23 deposited over said soft adjacent layer;

a second tantalum layer serving as a buffer formed on said antiferromagnetic layer;

a ferromagnetic magnetoresistive layer of NiFe deposited on said second tantalum layer, wherein said second tantalum buffer layer serves for texturing said NiFe ferromagnetic layer; and a sensing circuit coupled to said sensing device.

* * * * *